US008719736B1

(12) United States Patent
Zhang et al.

(10) Patent No.: US 8,719,736 B1
(45) Date of Patent: May 6, 2014

(54) COMPACT AND ACCURATE WAFER TOPOGRAPHY PROXIMITY EFFECT MODELING FOR FULL CHIP SIMULATION

(71) Applicant: Synopsys, Inc., Mountain View, CA (US)

(72) Inventors: Hongbo Zhang, Beaverton, OR (US); Nikolay Voznesenskiy, Tartu (EE); Qiliang Yan, Portland, OR (US); Ebo Kwabena Gyan Croffie, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/838,845

(22) Filed: Mar. 15, 2013

(51) Int. Cl.
*G06F 17/50* (2006.01)

(52) U.S. Cl.
USPC .......... 716/51; 716/50; 716/52; 716/53; 716/54; 716/56; 430/5; 430/30

(58) Field of Classification Search
USPC ..................... 716/50–56; 430/5, 30
See application file for complete search history.

(56) References Cited

U.S. PATENT DOCUMENTS

| 8,045,787 B2* | 10/2011 | Choi et al. ............... 382/144 |
| 2005/0283747 A1* | 12/2005 | Adam .......................... 716/4 |
| 2007/0082281 A1* | 4/2007 | Melvin et al. ................ 430/30 |
| 2009/0070730 A1* | 3/2009 | Zhang et al. ................ 716/19 |
| 2011/0029940 A1* | 2/2011 | Song et al. .................. 716/55 |
| 2011/0252387 A1* | 10/2011 | Liu et al. ..................... 716/55 |

OTHER PUBLICATIONS

Liu, Peng, et al.: "A full-chip 3D computational lithography framework", Optical Microlithography XXV, Proc. of SPIE, vol. 8326, 83260A (Feb. 21, 2012), 18 pages.
Song, Hue, et al.: "Wafer Topography Proximity Effect Modeling and Correction for Implant Layer Patterning", Photomask Technology, Proc. of SPIE, vol. 7488, 74883F (Sep. 23, 2009), 9 pages.
Voznesenskiy, Nikolay, et al.: "Large Scale Model of Wafer Topography Effects", Optical Microlithography XXIV, Proc. of SPIE, vol. 7973, 79732G (Mar. 22, 2011), 8 pages.

* cited by examiner

*Primary Examiner* — Nha Nguyen
(74) *Attorney, Agent, or Firm* — Beaver, Hoffman & Harms, LLP; Jeanette S. Harms

(57) ABSTRACT

A method for correcting topography proximity effects (TPE) for an integrated circuit (IC) design is described. This method includes dividing the IC design into a plurality of levels (z-direction). Each level can be decomposed into one or more elementary geometries. These elementary geometries can be top view geometries, cross-sectional geometries, half-plane geometries, geometries with single slope sides, and/or geometries with multiple slope sides. The one or more elementary geometries can be compared to primitives in a library. A transfer matrix can be generated using the matching primitives and the elementary geometries. A disturbance matrix can be calculated based on the transfer matrix. This disturbance matrix can advantageously capture a spectrum of a reflective electric field from a spectrum of an incident electric field. Wave propagation through a photoresist layer can be performed using the disturbance matrix for the plurality of levels. A light intensity for TPE correction can be computed based on the wave propagation.

22 Claims, 9 Drawing Sheets

Figure 6A

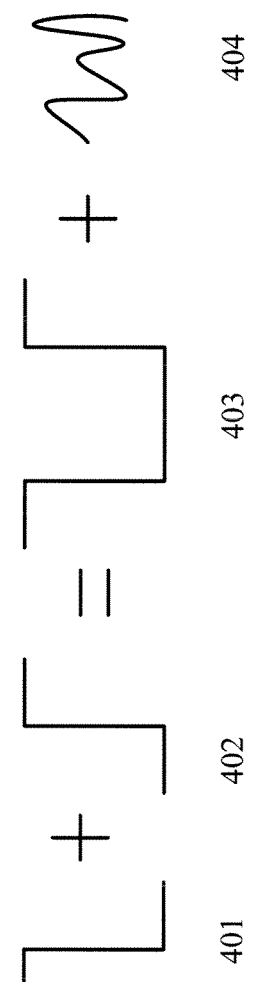
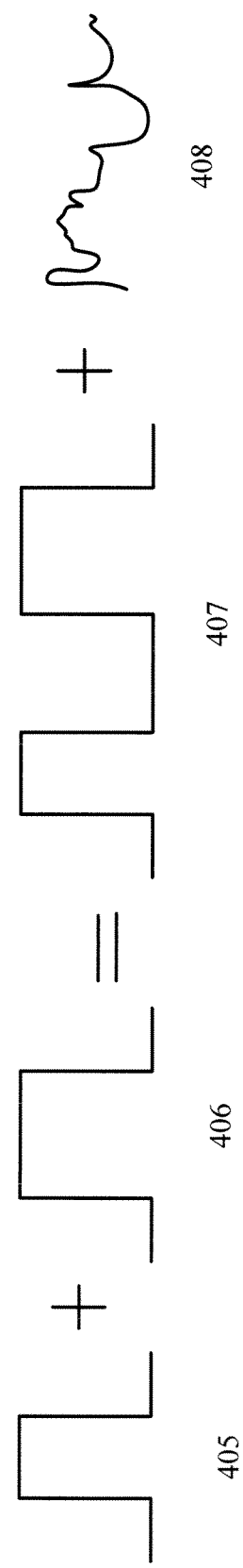
Figure 4A
Figure 4B

COMPACT AND ACCURATE WAFER TOPOGRAPHY PROXIMITY EFFECT MODELING FOR FULL CHIP SIMULATION

BACKGROUND

Photoresist is a light-sensitive material used in photolithography to form a patterned layer on a surface. In a positive resist, the portion of the photoresist that is exposed to light becomes soluble to a photoresist developer. The portion of the photoresist that is unexposed remains insoluble to the photoresist developer. In a negative resist, the portion of the photoresist that is exposed to light becomes insoluble to the photoresist developer. The portion of the photoresist that is unexposed is dissolved by the photoresist developer. The light used for developing photoresist includes ultraviolet (UV) or deep UV (DUV) light, wherein shorter wavelengths allow a reduced aspect ratio and hence a smaller minimum feature size to be achieved. The patterned photoresist is used to perform one or more subsequent processes on or in the underlying semiconductor layer. Thus, the fidelity of the patterned resist directly affects the resulting geometry of the underlying layer.

Light scattering from non-planar wafer topography substrates can cause light exposure in photoresist areas normally unexposed. FIG. 1 illustrates an exemplary substrate 101 including a plurality of non-planar topology features. These features include a shallow trench isolation (STI) area 102A and a polysilicon feature 104A, each of which can reflect light at different angles and affect the exposure of a desired patterned resist feature 103A. This scattered light tends to cause disruptions in pattern fidelity of the photoresist. These disruptions are called wafer substrate topography proximity effects (TPE) in the industry. For example, in the case of patterned resist 103A, the scattered light from STI 102A and polysilicon features 104A may result in a different critical dimension (CD) at the bottom than at the top. This CD variation may undesirably affect the CD transferred to the underlying area during a subsequent process.

Note that state-of-the-art integrated circuit (IC) designs are increasingly complex. Therefore, dense patterns rather than sparse patterns are increasingly prevalent in IC designs. For dense patterns, the wafer topography sensitivity of the photoresist CD appears to be more pronounced compared to sparse patterns due to the scattering of light described above. Therefore, the TPE problem is expected to worsen as IC designs continue to evolve in complexity.

TPE has been ignored for 45 nm and larger node technologies due to its relatively small impact to pattern CDs. For smaller node technologies, bottom anti-reflective coatings (BARCs) have been used in conjunction with photoresists to mitigate TPE. However, for an implant layer patterning step, BARC is not a preferred solution due to increased implant process complexity. Therefore, for 32 nm and 28 nm node technologies, rule-based correction or mask-based correction of TPE-induced CD variations can be used for the implant layer. However, for 20 nm node and below technologies, even more accurate TPE modeling becomes both desirable and necessary.

Tools to simulate photolithography effects are currently available. For example, the Sentaurus™ lithography (S-Litho™) tool provided by Synopsys, Inc. can accurately simulate wafer substrate topography proximity effects by solving Maxwell's equations. As known by those skilled in the art, Maxwell's equations are a set of partial differential equations that, together with the Lorentz force law, provide the rudiments of accurately estimating optical effects, including photolithography. Unfortunately, this approach is computationally intensive, and therefore has long runtimes. As a result, this approach is unsuitable for full-chip applications.

Therefore, a fast method for TPE modeling is needed to make full-chip TPE correction feasible.

SUMMARY

A method for correcting topography proximity effects (TPE) for an integrated circuit (IC) design is described. This method includes dividing the IC design into a plurality of levels (z-direction). Each level can be decomposed into one or more elementary geometries. These elementary geometries can be top view geometries, cross-sectional geometries, half-plane geometries, geometries with single slope sides, and/or geometries with multiple slope sides. The one or more elementary geometries can be compared to primitives in a library. A transfer matrix can be generated using the matching primitives and the elementary geometries. A disturbance matrix can be calculated based on the transfer matrix. This disturbance matrix can advantageously capture a spectrum of a reflective electric field from a spectrum of an incident electric field. Wave propagation through a photoresist layer can be performed using the disturbance matrix for the plurality of levels. A light intensity for TPE correction can be computed based on the wave propagation.

In one embodiment, the library is a transfer matrix library, which was generated by accurate simulation or an empirical data set. In one embodiment, generating the transfer matrix can include transforming one-dimensional features into two-dimensional rectangles (e.g. based on multiplying Fast Fourier Transform (FFT) spectrums), superposing transfer matrices of the two-dimensional rectangles. In another embodiment, generating the transfer matrix includes superposing transfer matrices of one-dimensional features into a cross-section, and superposing transfer matrices of multiple cross-sections.

When there is only one height (z-direction) of topography structures, irrespective of material, a disturbance matrix can be directly generated (instead of via the transfer matrix) using the matching primitives and the elementary geometries. In this embodiment, the library is a D-matrix library. Once again, wave propagation through a photoresist layer can be performed using the disturbance matrix for the plurality of levels. A light intensity for TPE correction can be computed based on the wave propagation.

A non-transitory, computer-readable medium storing computer-executable instructions for correcting topography proximity effects (TPE) is also described. These instructions when executed by a processor cause the processor to execute a process comprising the above-described steps.

BRIEF DESCRIPTION OF THE DRAWINGS

FIG. 4A illustrates an exemplary primitive element (a left half-plane structure E-field disturbance) and another exemplary primitive element (a right half-plane structure disturbance) that can be summed to generate a total E-field disturbance with a minimal residual disturbance.

FIG. 4B illustrates two exemplary primitive elements that can be summed, i.e. superposed, to generate a total E-field disturbance with a minimal residual disturbance.

DETAILED DESCRIPTION OF THE DRAWINGS

Figure 1:
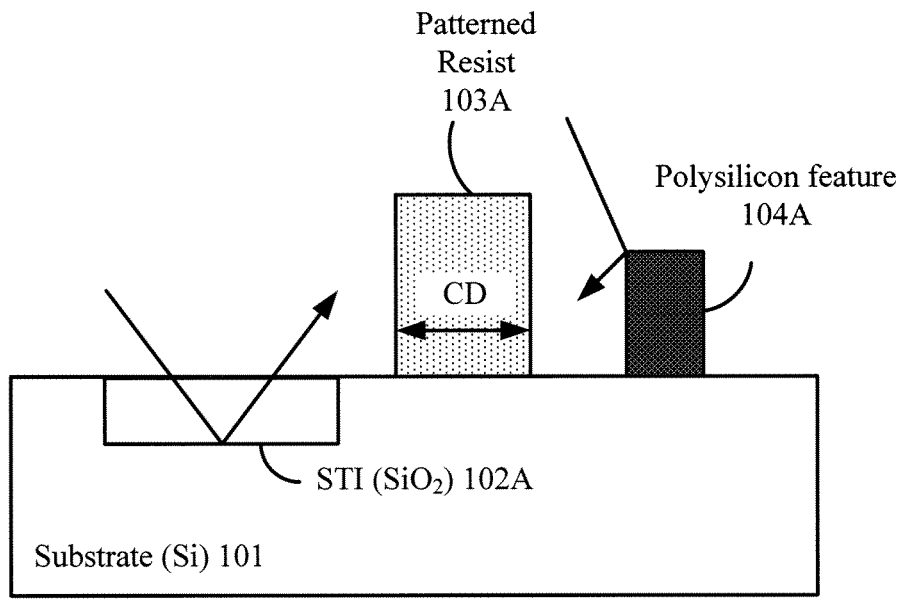
FIG. 1 illustrates an exemplary substrate including a plurality of non-planar topography features.
Figure 2:
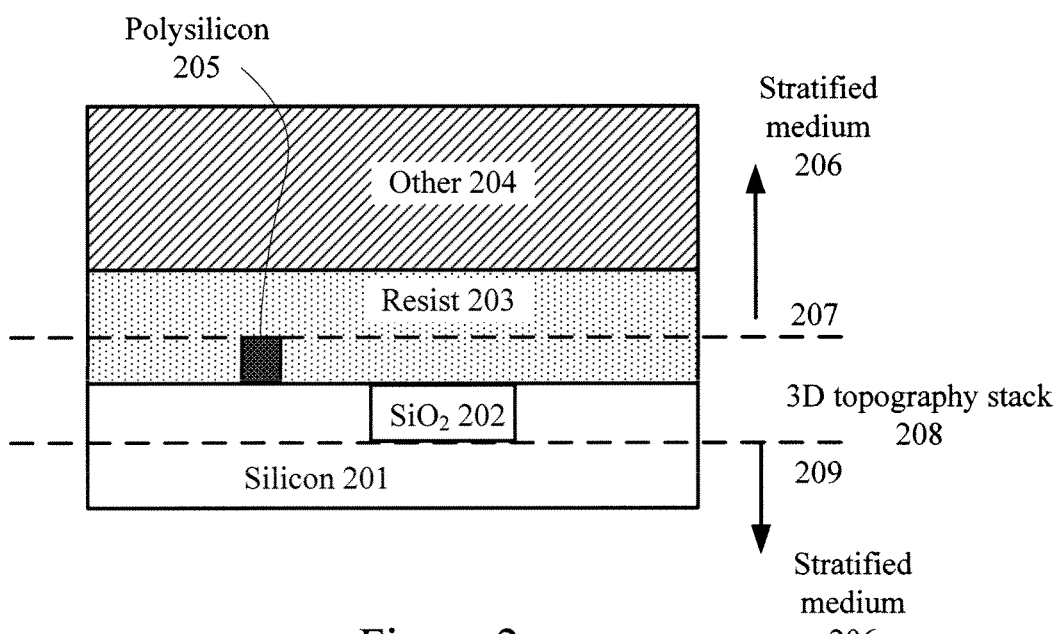
FIG. 2 illustrates a specific feature surface that delineates between stratified medium and a three-dimensional (3D) topography stack for disturbance-matrix analysis.

In accordance with one aspect of an improved full-chip simulation technique and system, a disturbance matrix (also called a D-matrix herein) can provide fast and accurate wafer topography proximity effect modeling. Specifically, the D-matrix technique can capture the behavior of a topography structure in or under the resist layer. For example, referring to FIG. 2, the D-matrix technique determines a level 207, which marks the top surface of a polysilicon feature 205 covered by a photoresist layer 203. The D-matrix technique assumes that elements above level 207 and below level 209 are a stratified medium 206, whereas the elements between levels 207 and 209 are a 3D topography stack 208. Note that to generate an E-Field in a stratified medium is known by those skilled in the art (straightforward and easy to compute), and therefore is not discussed in detail herein. Therefore, the D-matrix technique can focus on structures between levels 207 and 209, i.e. $SiO_2$ structure 202 (e.g. STI) and polysilicon structure 205.

Figure 3A:
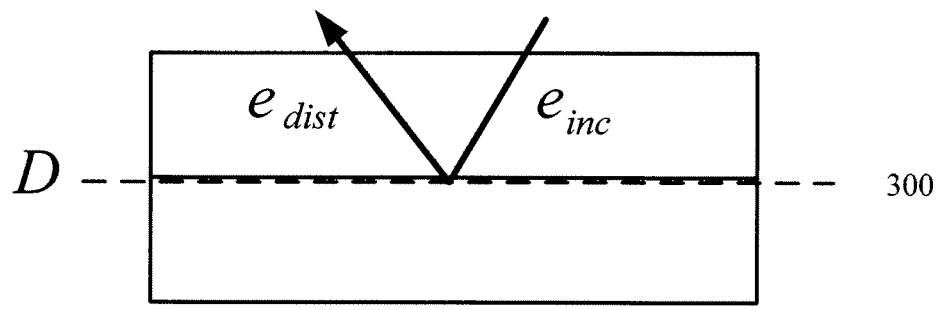
FIG. 3A illustrates a generic representation of an incident E-field ($e_{inc}$) and a reflective E-field ($e_{dist}$), wherein the D-matrix is computed at a level in the wafer.

FIG. 3A illustrates a generic representation of an incident E-field ($e_{inc}$) and a reflective E-field ($e_{dist}$), wherein the D-matrix is computed at a level 300. Because Maxwell's equations are linear, the frequency spectrum for E-field disturbance must be a linear response to the frequency spectrum of the incident E-field. Thus, mathematically, the D-matrix is a disturbance matrix, such that the spectrum of the reflective E-field ($e_{dist}$) and the spectrum of the incident E-field ($e_{inc}$) have the relationship:

$$\vec{e}_{dist} = D \cdot \vec{e}_{inc} \quad \text{(Eq. 1)}$$

Each column of the D-matrix is the spectrum of disturbance caused by a plane wave with a given incident angle.

Equation 1 can be modified to reflect a multi-layer wafer topography structure, at each level i, as follows:

$$\vec{e}_{dist,i} = D_i \cdot \vec{e}_{inc,i} \quad \text{(Eq. 2)}$$

The relationship between the consecutive layers i and i+1 is:

$$\begin{pmatrix} \vec{e}_{dist,i+1} \\ \vec{e}_{inc,i+1} \end{pmatrix} = T_i \cdot \begin{pmatrix} \vec{e}_{dist,i} \\ \vec{e}_{inc,i} \end{pmatrix} \quad \text{(Eq. 3)}$$

where $T_i$ is the transfer matrix (also called the T-matrix herein). Note that each column of the T-matrix for a level is the spectrum of the transferred and reflected fields under the level caused by two unit plane waves above the level (i.e. the incident and the reflected plane waves with a given incident/reflection angle).

From $D_i$ and $T_i$, $D_{i+1}$ can be calculated in a specific function:

$$D_{i+1} = f(D_i, T_i) \quad \text{(Eq. 4)}$$

Figure 3B:
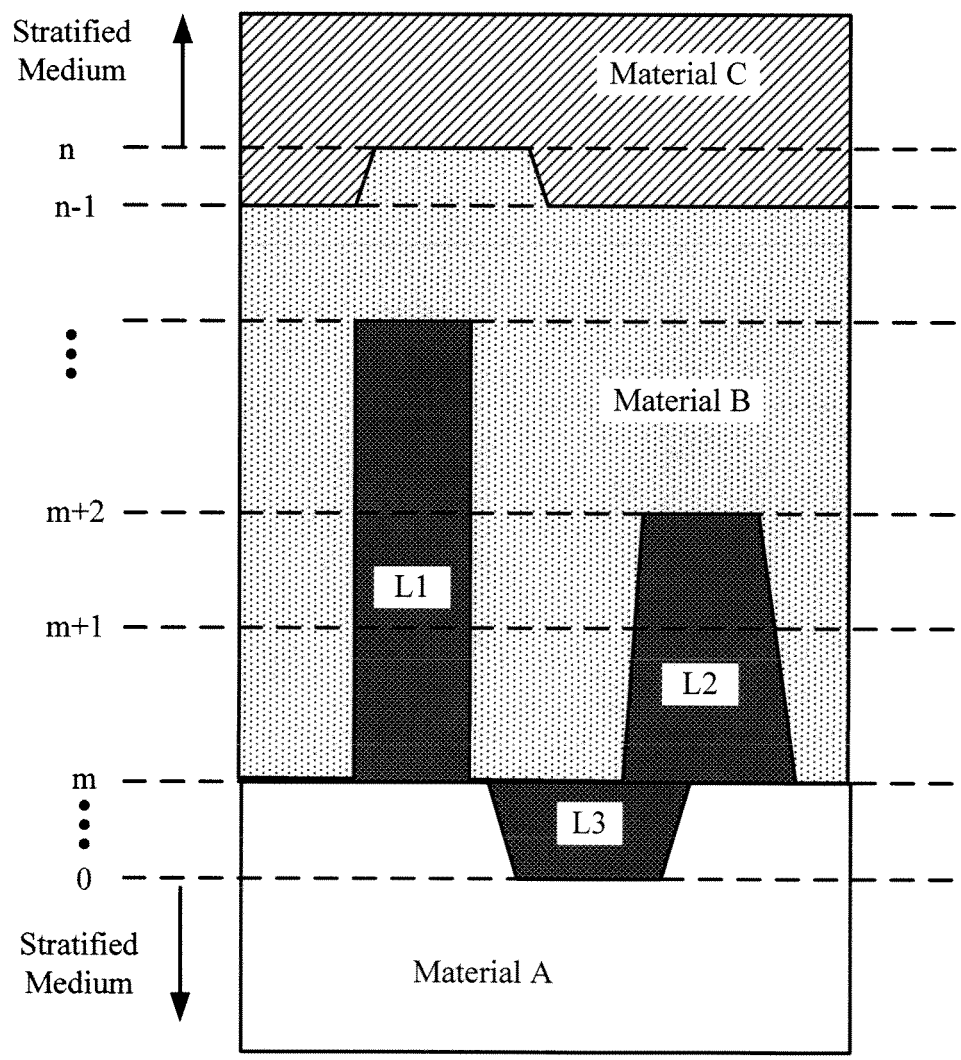
FIG. 3B illustrates that the D-matrix can be computed for various levels in the wafer.

For example, referring to FIG. 3B, which shows three different topography structures L1, L2, and L3 covered by material B, the transfer matrix at each level i would be:

$$T_i = \begin{pmatrix} t_{i,11} & t_{i,12} \\ t_{i,21} & t_{i,22} \end{pmatrix} \quad \text{(Eq. 5)}$$

where $t_{i,xy}$ is the sub-matrix with dimensions corresponding to subvectors of incident and reflected field in Eq. 3. Then the function can be represented by:

$$D_{i+1} = f(D_i, T_i) = \frac{D_i \cdot t_{i,11} + t_{i,12}}{D_i \cdot t_{i,21} + t_{i,22}} \quad \text{(Eq. 6)}$$

In accordance with one feature for improved TPE modeling, it is assumed that the E-field disturbance caused by half-plane topography structures can be superimposed to synthesize the D-matrix of any arbitrary structure. In other words, the total E-field disturbance is a sum of the individual E-field disturbances. With this approximation, the TPE problem can be advantageously reduced to computing the E-field disturbance caused by half-plane structures. For example, FIG. 4A illustrates that a left half-plane primitive 401 (and its associated E-field disturbance) and a right half-plane primitive 402 (and its associated E-field disturbance) can be summed, i.e. superposed, to generate a total E-field disturbance 403 with a minimal residual disturbance 404. FIG. 4B illustrates two exemplary primitives (and their associated E-field disturbances) 405 and 406 that can be summed to generate a total E-field disturbance 407 with a minimal residual disturbance 408.

In accordance with one feature for improved TPE modeling, it is assumed that the transfer matrix of elementary topography structures can be superposed to synthesize the T-matrix of any arbitrary structure. In other words, the total T-matrix is a sum of the individual T-matrices. With this approximation, the TPE problem can be advantageously reduced to computing the T-Matrix caused by elementary structures.

Figure 5:
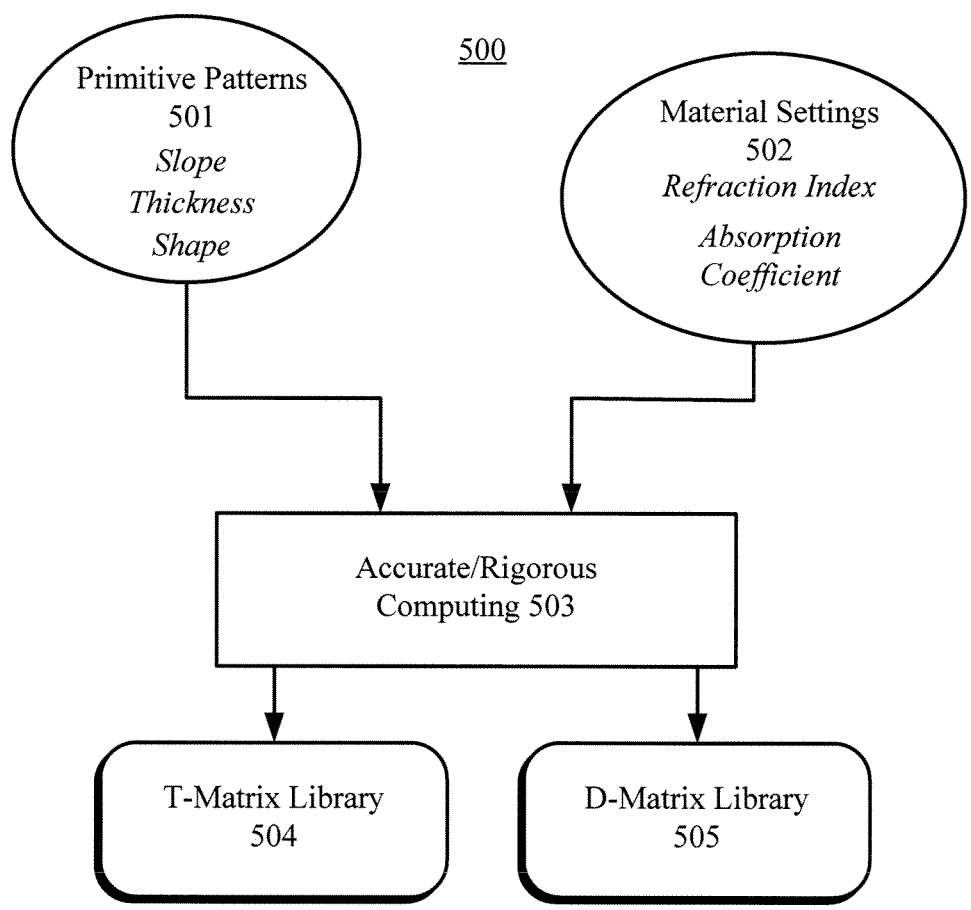
FIG. 5 illustrates an exemplary technique for generating a T-matrix library and/or a D-matrix library.

In accordance with another aspect of improved TPE modeling, a T-matrix library can be generated. FIG. 5 illustrates an exemplary technique 500 for generating a T-matrix library and/or a D-matrix library. In step 503, accurate/rigorous computing can be performed on a plurality of primitive patterns 501 and a plurality of material settings 502.

Primitive patterns 501 can include the edge slope, the thickness, the width, and/or the shape of a structure. Note that for library-based methods, model accuracy requirements often times necessitate the use of pattern-specific primitives. While these primitives enable good model accuracy for problematic patterns, it makes the model quality pattern dependent, thereby potentially lessening the model's predictability. Therefore, in one embodiment, half-plane primitives can be included, which facilitates easily synthesizing any arbitrary geometry pattern. In another embodiment, Manhattan geometry patterns rules can apply to the library primitives, e.g. defining only a concave corner or a convex corner, and ensuring that edges of the structures of the IC design are parallel to the x and y axes. Therefore, in that embodiment, the T-matrix library is advantageously pattern independent.

Material settings 502 can include the optical properties of structure materials, e.g. refraction index, absorption coefficient, etc.

In one embodiment, the S-Litho™ tool provided by Synopsys, Inc. can be used for step 503. Based on the resulting of the computing, a T-matrix library 504 and a D-matrix 505 can be generated. In general, the resulting primitives of T-Matrix library 504 and D-matrix 505 can include at least one of top view geometries, cross-sectional geometries, half-plane geometries, geometries with single slope sides, and geometries with multiple slope sides. Note that the composition of these libraries is resource and time dependent, which will vary from one application to another. T-matrix library 504 and D-matrix 505 can be stored and used for the D-matrix synthesis technique described below. Although both T-matrix library 504 and D-matrix 505 can be generated, in some embodiments, only one of T-matrix 504 and D-matrix 505 may be generated and stored.

Figure 6A:
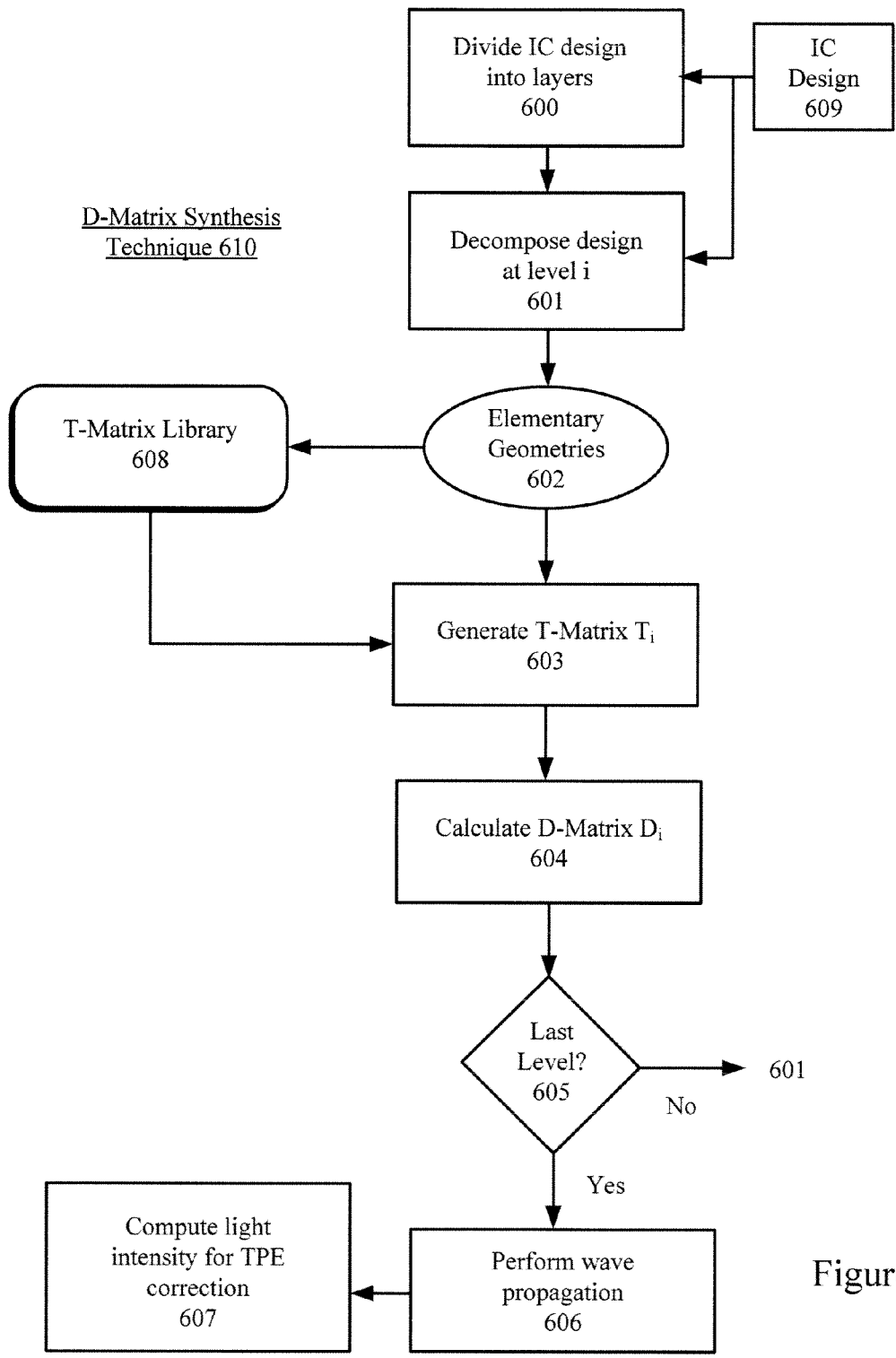
FIGS. 6A and 6B illustrate exemplary techniques for generating the D-matrix, which in turn can be used to compute a light intensity for TPE correction and verification.

FIG. 6A illustrates an exemplary technique 610 for generating a D-matrix, which in turn can be used to compute a light intensity for TPE correction and verification. In step 600, an IC design 609 for implementing an integrated circuit (IC) design can be divided into a plurality of layers (i.e. at least a bottom layer and a top layer). In step 601, an IC design 609 at a predetermined level i can be decomposed into one or more elementary geometries 602. These elementary geometries 602 can be compared to the primitives in a T-matrix library 608 (see, e.g. FIG. 5). In step 603, the T-matrix $T_i$ can be generated using the primitives provided by T-matrix library 608 and the information regarding elementary geometries 602, e.g. including location and combination information. Thus, step 603 can be characterized as a T-matrix synthesis process (described in further detail in FIG. 7). In step 604, the D-matrix $D_i$ can be calculated using equations 2-6 above. Note that the bottom level can be calculated using well-known equations for stratified medium, such as those described in "Optical Imaging in Projection Microlithography", page 122-123, SPIE Press, 2005. The D-matrix $D_i$ can accurately capture the $e_{dist}$ from the $e_{inc}$. If the current level i is not the last level, as determined in step 605, then technique 600 returns to step 601 to begin analysis of another level.

If the current level i is the last level, then wave propagation including the D-matrix (at a plurality of levels) can be performed in step 606. The total number of levels depends on the accuracy requirement as well as the minimum number of levels needed from the current wafer topography setting. In one embodiment, wave propagation can be efficiently generated inside the stratified medium assuming a known projection system and mask. After the D-Matrix is generated for the plurality of levels, the wave propagation can be either upward or downward, depending on the need, i.e. where is the point of interest for the light intensity calculation. For the upward wave propagation, a known technique, such as that described in "Optical Imaging Projection Microlithography", pages 122-123, SPIE, 2005, can be used. For the downward wave propagation, the T-matrix can be reused or slightly modified to calculate the E-Field at each level. In one embodiment, the E-Field at each level i can be calculated as the following equation:

$$\begin{pmatrix} \vec{e}_{dist,i} \\ \vec{e}_{inc,i} \end{pmatrix} = R_i \cdot \begin{pmatrix} \vec{e}_{dist,i+1} \\ \vec{e}_{inc,i+1} \end{pmatrix} \quad \text{(Eq. 7)}$$

where $R_i$ can be generated at the same time with $T_i$. $R_i$ and $T_i$ are the generalized inverse matrix of each other. Because the downward wave propagation can generate the E-Field on each level, the more levels used yields a more detailed E-Field distribution.

In step 607, based on the results of wave propagation, the light intensity for TPE correction can be computed. This computation involves two fields: the disturbed field and the incident field. These fields, both now available, can be summed to obtain a full field. The resist model (e.g. positive, negative) and the full field can be used to compute the light intensity, which is well known to those skilled in the art.

Figure 6B:
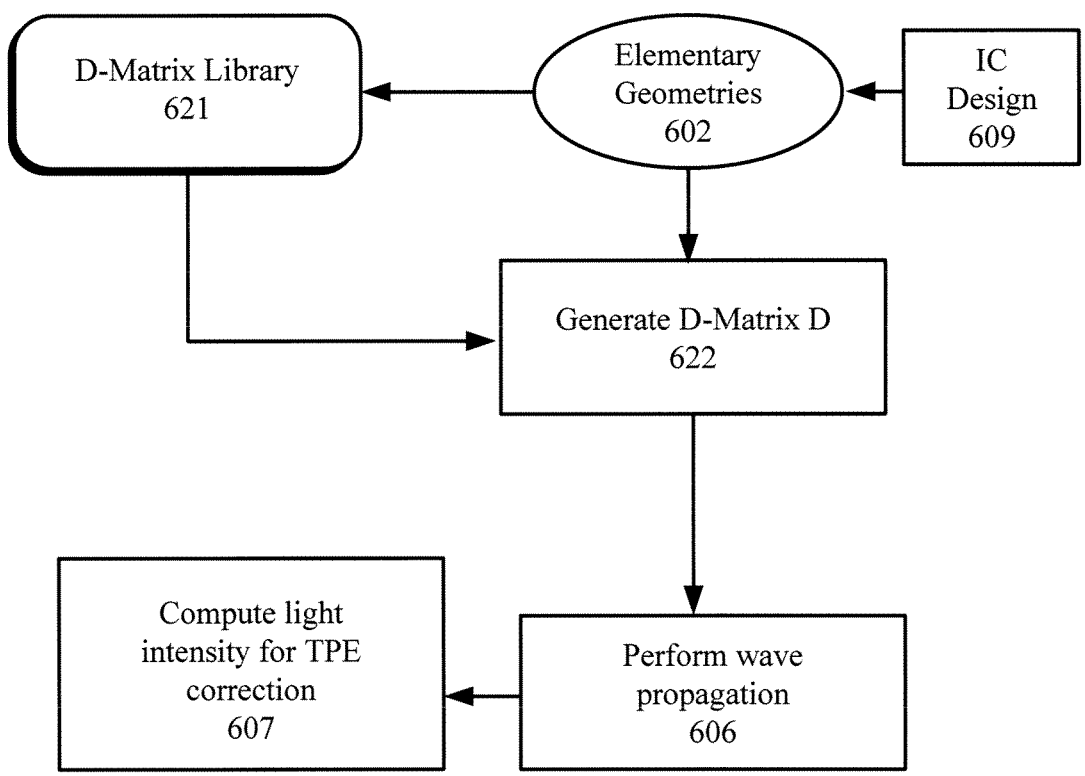

FIG. 6B illustrates another exemplary technique 620 for generating a D-matrix, which in turn can be used to compute a light intensity for TPE correction and verification. The descriptions of steps having the same labeling as in FIG. 6A are not repeated. In technique 620, in step 622, the D-matrix can be generated directly from a D-matrix library 621 (see, e.g. FIG. 5) and elementary geometries 602. Note that this generation merely includes superposing the primitives of D-matrix library 621 in the locations indicated by elementary geometries 602. This technique is particularly desirable when only one layer exists between the stratified mediums (top and bottom mediums). Note that this layer refers to structures (of any composition) in that layer of only one height.

Figure 7:
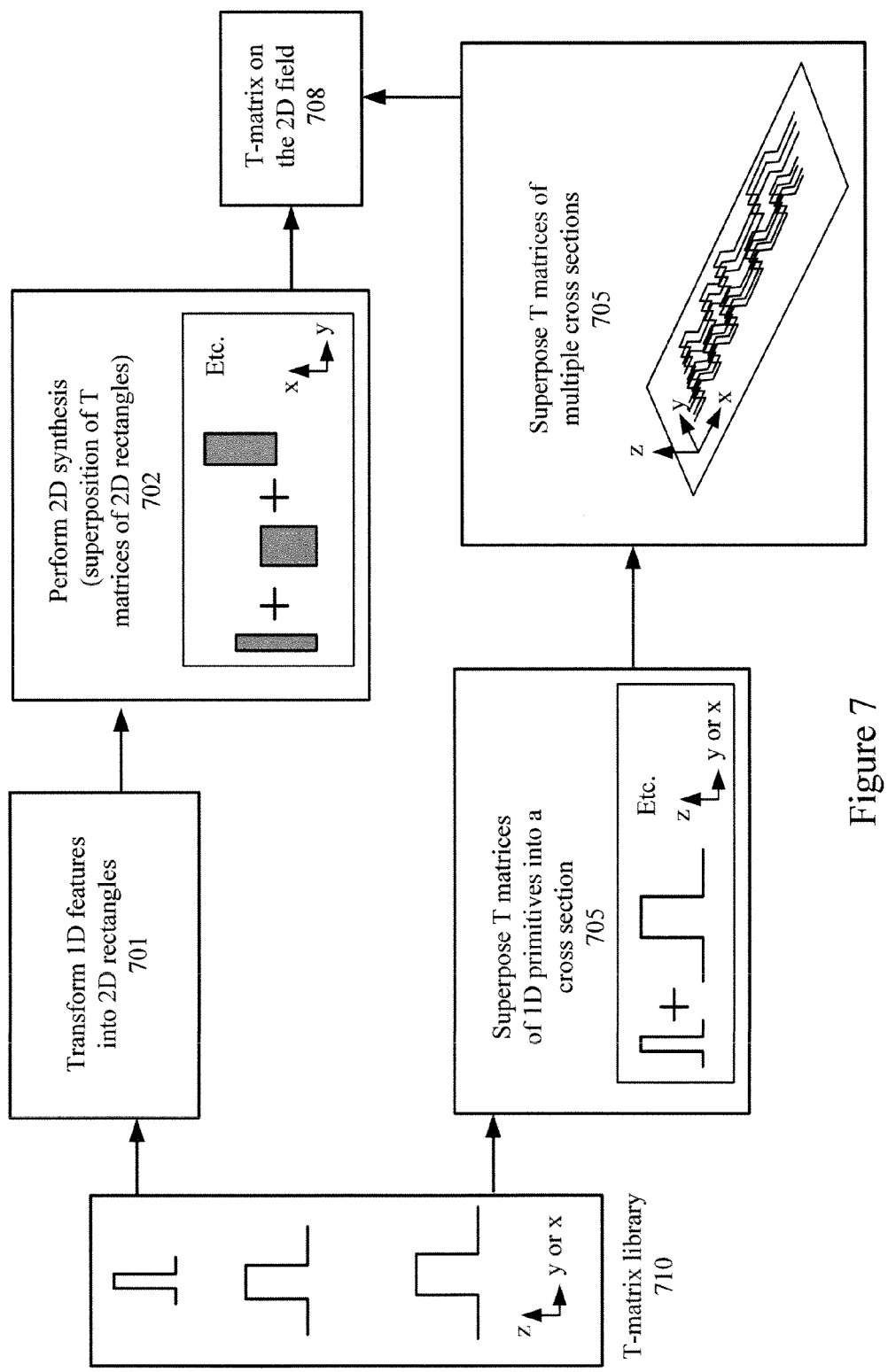
FIG. 7 illustrates two exemplary T-matrix synthesis processes that can be used to generate the T-matrix.

FIG. 7 illustrates two exemplary T-matrix synthesis processes that can be used to generate the T-matrix. In a first process, the 1D primitives of T-matrix library 710 identified to be matching the wafer topography pattern at the layer i can be transformed into 2D rectangles in step 701. This transformation can be performed as the example shown below:

$$E_x(f_x,f_y)=E_x(f_x) \cdot E_x(f_y)$$

where $E_x$ is the X-axis component of the electric field spectrum, $f_x$ is the spatial frequency along x-axis, and $f_y$ is the spatial frequency along y-axis. A similar equation, not shown, is valid for the Y-axis component $E_y$. In step 702, 2D synthesis can be performed. This synthesis can include the superposition, i.e. summation, of the T matrices of the 2D rectangles provided by step 701 (the T matrices shown representationally by the rectangles in FIG. 7).

In a second T-matrix synthesis process, the T matrices of the 1D primitives of T-matrix library 710 identified as matching the wafer topography pattern at the layer i can be superposed into a cross-section in step 705. In step 706, the T-matrices of multiple 1D cross-sections can be superposed. This second synthesis process can be particularly useful for complicated polygonal Manhattan-type layouts, such as well implants. In one embodiment, either the first process or the second process generates the T-matrix on a 2D field. In another preferred embodiment, both processes can be used to generate T-matrices for both top view and cross-sectional views.

Figure 8B:
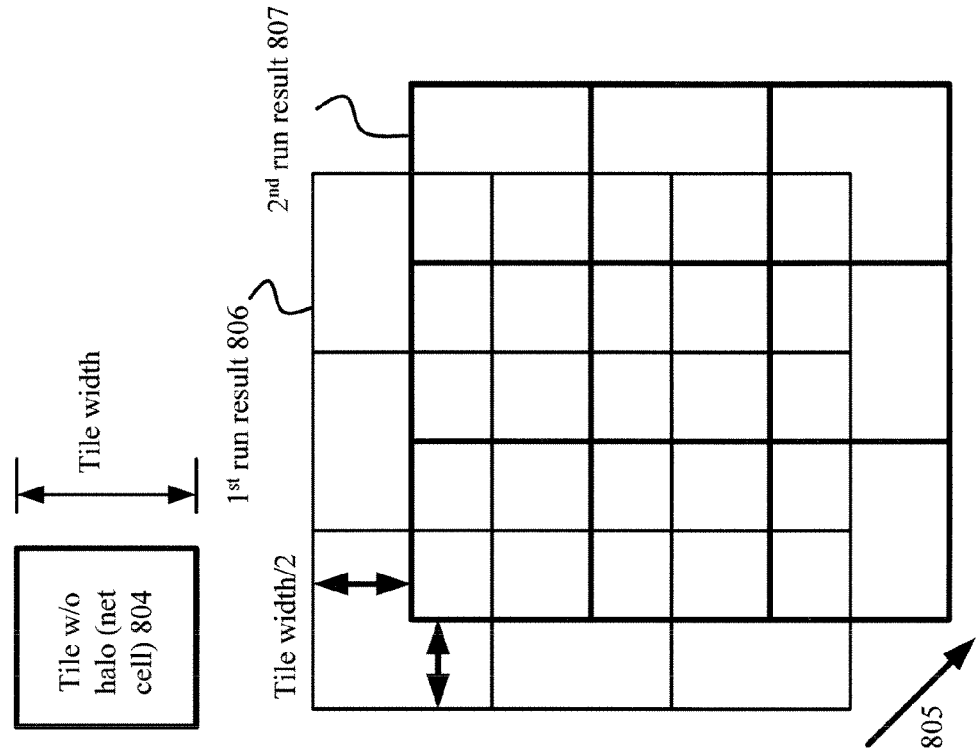
FIGS. 8A and 8B illustrate two exemplary synthesis processes that can be used to generate a large or a full chip result.
Figure 8A:
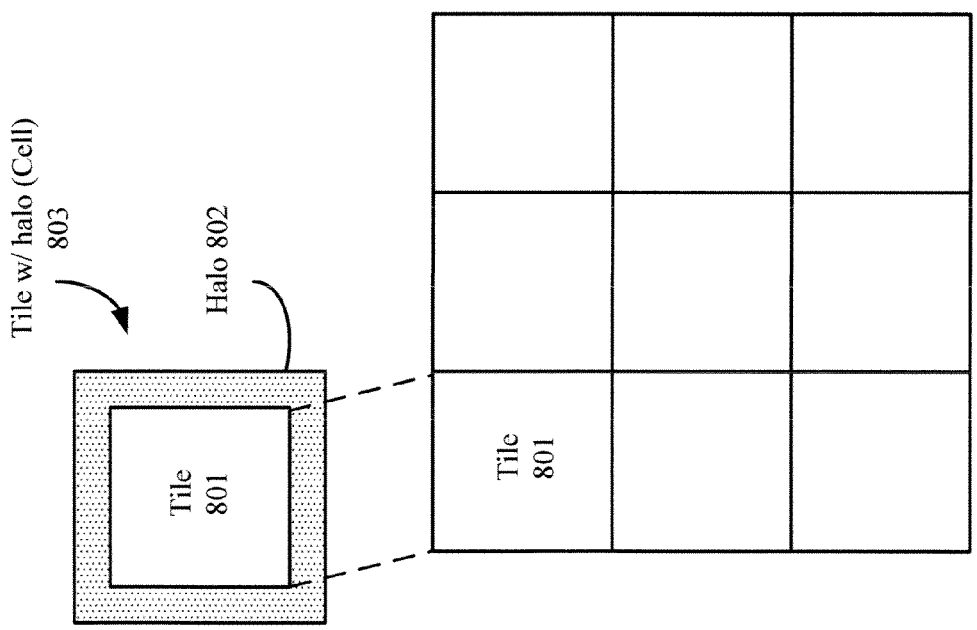

FIGS. 8A and 8B are two tiling techniques that can combine smaller scale results to generate a large/full chip region result. In FIG. 8A, the result of each predetermined area (top view), called a "tile" 801, of the layer is computed with a "halo" 802, thereby generating a cell 803. In one embodiment, the combination of cells 803 can be performed by stitching all the internal tiles 801 together with the results in halos 802 removed. In FIG. 8B, the result of each predetermined area (top view), called a tile without halo (net cell) 804, of the layer is computed. In this way, only the central region of each net cell 804 has its result calculated accurately. In one embodiment, the combination of net cells 804 can be performed by stitching all the net cells 804 together to generate the 1st run result 806. To mitigate the inaccuracy at the boundary of each net cell, all the net cell locations are moved by a shift 805 of a Tilewidth/2 distance on both x and y directions. A second computing is performed on all net cells with the new locations; then by stitching, the 2nd run result 807 is generated. By combining/averaging the 1st run result 806 and the 2nd run result 807 together, the final, full region results can be provided. In one embodiment, averaging of two results 806 and 807 may be performed with weights being varied from the center of each net cell 804 to its boundaries. This weighting function is adjusted depending on required accuracy of TPE capturing.

The D-matrix synthesis technique provides a fast and predictive method to simultaneously simulate the lithography distortions due to wafer topography effect. It is efficient to generate the overall light intensity profile inside the photoresist. The D-matrix synthesis technique is proved to have high accuracy compared to existing methods. The D-matrix synthesis technique is compatible with various mask shapes and mask effects. This efficiency makes it possible to have TPE considered for full-chip simulation.

Figure 9:
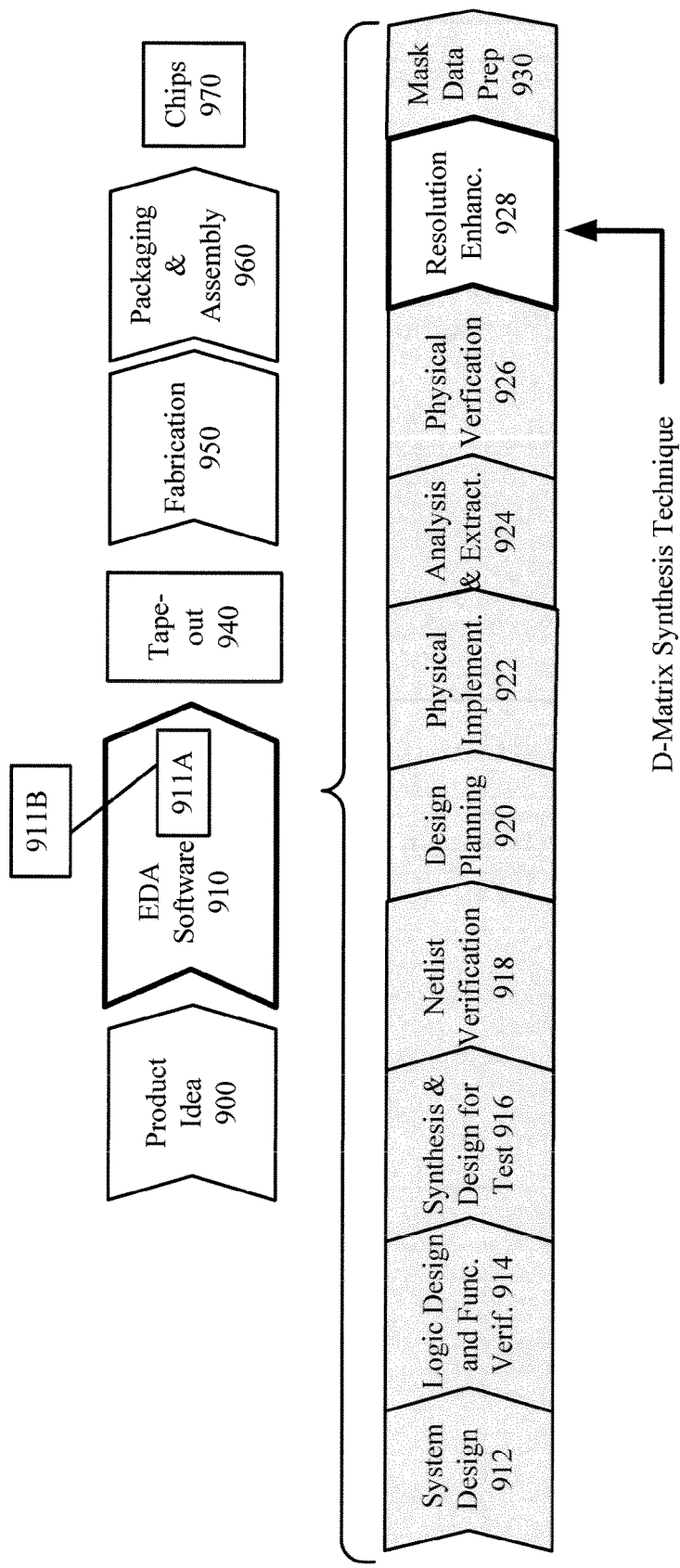
FIG. 9 shows a simplified representation of an exemplary digital ASIC design flow including the above-described D-matrix synthesis technique.

FIG. 9 shows a simplified representation of an exemplary digital ASIC design flow including the above-described D-matrix synthesis technique. At a high level, the process starts with the product idea (step 900) and is realized in an EDA software design process (step 910). When the design is finalized, it can be taped-out (event 940). After tape out, the fabrication process (step 950) and packaging and assembly processes (step 960) occur resulting, ultimately, in finished chips (result 970).

The EDA software design process (step 910) is actually composed of a number of steps 912-930, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components/steps of the EDA software design process (step 910) will now be provided. In one embodiment, one or more steps of the EDA software design process can be implemented using a computer-readable medium 911A, which is read by a computer 911B. Note that Astro, AstroRail, CustomSim, ESP, Hercules, IC Compiler, Magellan, Model Architect, Power Compiler, PrimeRail, Proteus, ProteusAF, PSMGen, Saber, StarRC, and System Studio are trademarks of Synopsys, Inc., and CATS, DesignWare, Design Compiler, Formality, HSIM, Leda, NanoSim, Primetime, Syndicated, TetraMAX, VCS, and Vera are registered trademarks of Synopsys, Inc. System design (step 912): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect™, Saber™, System Studio™, and DesignWare® products.

Logic design and functional verification (step 914): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include HSIM®, NanoSim®, CustomSim™, VCS®, VERA®, DesignWare, Magellan™, Formality®, ESP™ and LEDA® products.

Synthesis and design for test (step 916): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler™, Tetramax®, and DesignWare® products.

Netlist verification (step 918): At this step, the netlist is checked for compliance with timing constraints and for correspondence with the VHDL/Verilog source code. Exemplary EDA software products from Synopsys, Inc. that can be used at this step include Formality®, PrimeTime™, and VCS® products.

Design planning (step 920): Here, an overall floorplan for the chip is constructed and analyzed for timing and top-level routing. Exemplary EDA software products from Synopsys, Inc. that can be used at this step include Astro™ and IC Compiler™ products.

Physical implementation (step 922): The placement (positioning of circuit elements) and routing (connection of the same) occurs at this step. Exemplary EDA software products from Synopsys, Inc. that can be used at this step include the Astro™ and IC Compiler™ products.

Analysis and extraction (step 924): At this step, the circuit function is verified at a transistor level, this in turn permits what-if refinement. Exemplary EDA software products from Synopsys, Inc. that can be used at this step include AstroRail™, PrimeRail™, Primetime, and Star RC/XT products.

Physical verification (step 926): At this step various checking functions are performed to ensure correctness for: manufacturing, electrical issues, lithographic issues, and circuitry. Exemplary EDA software products from Synopsys, Inc. that can be used at this step include the Hercules™ product.

Resolution enhancement (step 928): This step involves geometric manipulations of the layout to improve manufacturability of the design. Exemplary EDA software products from Synopsys, Inc. that can be used at this step include Proteus™, ProteusAF™, and PSMGen™ products. In one embodiment, the above-described D-matrix synthesis technique can be performed in step 928.

Mask data preparation (step 930): This step provides the "tape-out" data for production of masks for lithographic use to produce finished chips. Exemplary EDA software products from Synopsys, Inc. that can be used at this step include the CATS® family of products.

The D-matrix synthesis technique described above can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

The invention claimed is:

1. A method for correcting topography proximity effects (TPE) for an integrated circuit (IC) design, the method comprising:
    dividing the IC design into a plurality of levels;
    for each level,
    decomposing the level into one or more elementary geometries;
    comparing the one or more elementary geometries to primitives in a library, the library being a transfer matrix library generated by accurate simulation or an empirical data set;
    generating a transfer matrix using matching primitives provided by said comparing the one or more elementary geometries;
    calculating, using a computer, a disturbance matrix based on the transfer matrix, the disturbance matrix capturing a spectrum of a reflective electric field from a spectrum of an incident electric field;
    performing wave propagation through a layer or layers using the disturbance matrix for the plurality of levels; and
    computing a light intensity for TPE correction based on the wave propagation.

2. The method of claim 1, wherein the library includes at least one of top view geometries, cross-sectional geometries, half-plane geometries, geometries with single slope sides, and geometries with multiple slope sides.

3. The method of claim 1, wherein said generating the transfer matrix includes superposing topography structures of the primitives.

4. The method of claim 3, wherein said superposing includes using information regarding the topography structures, the information including location of the topography structures and a combination of the topography structures.

5. The method of claim 1, wherein said generating the transfer matrix includes transforming one-dimensional features into two-dimensional rectangles.

6. The method of claim 5, wherein said transforming is based on multiplying Fast Fourier Transform (EFT) spectrums.

7. The method of claim 6, wherein said generating the transfer matrix further includes superposing transfer matrices of the two-dimensional rectangles.

8. The method of claim 1, wherein said generating the transfer matrix includes superposing transfer matrices of one-dimensional features into a cross-section.

9. The method of claim 1, wherein said generating the transfer matrix further includes superposing transfer matrices of multiple cross-sections.

10. A non-transitory, computer-readable medium storing computer-executable instructions for correcting topography proximity effects for an integrated circuit (IC) design, the instructions when executed by a processor cause the processor to execute a process comprising:
    dividing the IC design into a plurality of levels;
    for each level,
    decomposing the level into one or more cross-sectional elementary geometries;
    comparing the one or more cross-sectional elementary geometries to primitives in a library, the library being a transfer matrix library generated by accurate simulation or an empirical data set;
    generating a transfer matrix using matching primitives provided by said comparing the one or more cross-sectional elementary geometries;
    calculating a disturbance matrix based on the transfer matrix, the disturbance matrix capturing a spectrum of a reflective electric field from a spectrum of an incident electric field;
    performing wave propagation through a layer or layers using the disturbance matrix for the plurality of levels; and
    computing a light intensity for TPE correction based on the wave propagation.

11. The non-transitory, computer-readable medium of claim 10, wherein the library includes at least one of top view geometries, cross-sectional geometries, half-plane geometries, geometries with single slope sides, and geometries with multiple slope sides.

12. The non-transitory, computer-readable medium of claim 10, wherein said generating the transfer matrix includes superposing topography structures of the primitives.

13. The non-transitory, computer-readable medium of claim 12, wherein said superposing includes using information regarding the topography structures, the information including location of the topography structures and a combination of the topography structures.

14. The non-transitory, computer-readable medium of claim 10, wherein said generating the transfer matrix includes transforming one-dimensional features into two-dimensional rectangles.

15. The non-transitory, computer-readable medium of claim 14, wherein said transforming is based on multiplying Fast Fourier Transform (FFT) spectrums.

16. The non-transitory, computer-readable medium of claim 14, wherein said generating the transfer matrix further includes superposing transfer matrices of the two-dimensional rectangles.

17. The non-transitory, computer-readable medium of claim 10, wherein said generating the transfer matrix includes superposing transfer matrices of one-dimensional features into a cross-section.

18. The non-transitory, computer-readable medium of claim 10, wherein said generating the transfer matrix further includes superposing transfer matrices of multiple cross-sections.

19. A method for correcting topography proximity effects (TPE) for an integrated circuit (IC) design, the method comprising:
    decomposing the IC design into one or more elementary geometries;
    comparing the one or more elementary geometries to primitives in a library, the library being a disturbance matrix library generated by accurate simulation or an empirical data set;

generating, using a computer, a disturbance matrix using matching primitives provided by said comparing the one or more elementary geometries, the disturbance matrix capturing a spectrum of a reflective electric field from a spectrum of an incident electric field;

performing wave propagation using the disturbance matrix; and computing a light intensity for TPE correction based on the wave propagation.

20. The method of claim 19, wherein the library includes at least one of top view geometries, cross-sectional geometries, half-plane geometries, geometries with single slope sides, and geometries with multiple slope sides.

21. A non-transitory, computer-readable medium storing computer-executable instructions for correcting topography proximity effects for an integrated circuit (IC) design, the instructions when executed by a processor cause the processor to execute a process comprising:

decomposing the IC design into one or more elementary geometries;

comparing the one or more elementary geometries to primitives in a library, the library being a disturbance matrix library generated by accurate simulation or an empirical data set;

generating a disturbance matrix using matching primitives provided by said comparing the one or more elementary geometries, the disturbance matrix capturing a spectrum of a reflective electric field from a spectrum of an incident electric field;

performing wave propagation using the disturbance matrix; and computing a light intensity for TPE correction based on the wave propagation.

22. The method of claim 21, wherein the library includes at least one of top view geometries, cross-sectional geometries, half-plane geometries, geometries with single slope sides, and geometries with multiple slope sides.

* * * * *